(12) United States Patent
McKarris

(10) Patent No.: US 12,074,562 B2
(45) Date of Patent: Aug. 27, 2024

(54) SELF-CLEANING SYSTEM FOR A LIGHT-RECEIVING SUBSTRATE

(71) Applicant: George McKarris, Meyrin (CH)

(72) Inventor: George McKarris, Meyrin (CH)

(73) Assignee: CleanFizz SA, Satigny (CH)

( * ) Notice: Subject to any disclaimer, the term of this patent is extended or adjusted under 35 U.S.C. 154(b) by 525 days.

(21) Appl. No.: 17/145,122

(22) Filed: Jan. 8, 2021

(65) Prior Publication Data
US 2021/0135621 A1    May 6, 2021

Related U.S. Application Data

(63) Continuation-in-part of application No. 15/423,580, filed on Feb. 2, 2017, now abandoned, which is a continuation-in-part of application No. 14/498,930, filed on Sep. 26, 2014, now abandoned, which is a continuation-in-part of application No. 13/519,508, filed as application No. PCT/IB2011/050422 on Jan. 31, 2011, now abandoned.

(51) Int. Cl.
| | | |
|---|---|---|
| *H02S 40/10* | (2014.01) | |
| *B08B 6/00* | (2006.01) | |
| *B08B 13/00* | (2006.01) | |
| *H02S 40/42* | (2014.01) | |

(52) U.S. Cl.
CPC ............. *H02S 40/10* (2014.12); *B08B 6/00* (2013.01); *B08B 13/00* (2013.01); *H02S 40/42* (2014.12)

(58) Field of Classification Search
CPC .......... H02S 40/10; H02S 40/12; H02S 40/40; H02S 40/42; H02S 40/425; H02S 40/44
See application file for complete search history.

(56) References Cited

U.S. PATENT DOCUMENTS

| | | | |
|---|---|---|---|
| 2003/0116185 A1* | 6/2003 | Oswald | H01L 31/0463 136/251 |
| 2009/0223555 A1* | 9/2009 | Ammar | H01L 31/0543 136/246 |
| 2009/0266353 A1* | 10/2009 | Lee | F24S 40/20 126/593 |
| 2010/0000594 A1* | 1/2010 | Zalusky | H01L 31/052 136/246 |

(Continued)

OTHER PUBLICATIONS

Williams et al., "Vibration Characterization of Self-Cleaning Solar Panels with Piezoceramic Actuation", 2007, 48th AIAA/ASME/ASCE/AHS/ASC Structures, Structural Dynamics, and Materials Conference, All Pages. (Year: 2007).*

*Primary Examiner* — Daniel P Malley, Jr.

(57) ABSTRACT

A self-cleaning system for a light-receiving substrate is able to detect a particulate on a designated surface of the light-receiving substrate and is then able to clean off of the designated surface with contactless electrostatic waves. The self-cleaning system includes a plurality of conductive traces, a microcontroller, a pulsed electrostatic-field generator, and a direct current (DC) power source. The conductive traces are electrodes that use the electrostatic waves to levitate and move the particulate off of the designated surface. The pulsed electrostatic-field generator creates the pulsed electrostatic fields that accumulate into the electrostatic waves. The microcontroller instructs and manages the electronic parts of the self-cleaning system. The DC power source is used to power the electrical parts of the self-cleaning system.

18 Claims, 16 Drawing Sheets

(56) References Cited

U.S. PATENT DOCUMENTS

| | | | | |
|---|---|---|---|---|
| 2011/0283477 | A1* | 11/2011 | Ashpis | H05H 1/2439 15/405 |
| 2013/0278063 | A1* | 10/2013 | Fowler | H02S 40/42 307/43 |
| 2014/0375343 | A1* | 12/2014 | Chen | G08B 21/182 324/750.02 |
| 2018/0115277 | A1* | 4/2018 | Chapman | H02S 40/32 |
| 2018/0316303 | A1* | 11/2018 | Bailey | H02S 40/10 |

* cited by examiner

US 12,074,562 B2

SELF-CLEANING SYSTEM FOR A LIGHT-RECEIVING SUBSTRATE

The current application is a continuation-in-part (CIP) application of the U.S. non-provisional application Ser. No. 15/423,580 filed on Feb. 2, 2017. The U.S. non-provisional application Ser. No. 15/423,580 is a CIP application of the U.S. non-provisional application Ser. No. 14/198,930 filed on Sep. 26, 2014.

FIELD OF THE INVENTION

The present invention generally relates to contactless cleaning of a solar panel. More specifically, the present invention is able to automatically detect the need to the solar panel and is then able to clean of the solar panel using electrostatic waves.

BACKGROUND OF THE INVENTION

A major problem that has been identified with the use of solar panels (in particular the ones used in deserts and places where the sun illumination is particularly effective) is the frequent dust and sand cleaning off solar panels and glass façades, which is needed. Indeed, a regular cleaning of the solar panels has to be made in order to keep the efficiency at the highest percentage possible. Efficiency of a solar panel can decrease by as much as 30% due to dirt and dust or even much more due to accumulated snow on the solar panel. Solar panel manufacturers advise a minimum of one cleaning a month. In some situations, it is not easy to climb to a roof in order to clean the panel. Traditional cleaning causes scratches to surfaces, which reduces the efficiency of the solar panel. In most cases, cleaning requires solvents, water, personnel time, equipment and machinery. In addition, such solar panels are usually spread out on large areas to build large surfaces and the cleaning of such large areas is time consuming.

Therefore, an objective of the present invention is to provide improved solar panels. More specifically, the objective of the present invention is to provide solar panels that can be easily and effectively cleaned so that these solar panels keep their properties and efficiency over time. Accordingly, the present invention is an intelligent self-cleaning multilayer coating to address the cleaning of surfaces such as solar panels, glass windows, or any similar surfaces that require cleaning. The surface of a solar panel is equipped with various detectors such as luminosity, temperature, humidity, and others for automatic operation or can be manually operated. In the case of a transparent surface, the light transmission efficiency is monitored regularly and compared with the initial factory calibration. The intelligent electronics decides to activate the self-cleaning system in relation with the decrease in efficiency taking into consideration the time zone, luminosity, temperature, and weather conditions of the geospatial region. The electronics will activate four independent direct current (DC) powered pulsed electrostatic fields when detecting dirt or sand on the panel or use the same elements on the surface to melt down the snow. The electronic means include typically of the power input and regulation of the board, a microcontroller, monitoring electronics, electrostatic field power electronics and communication electronics. This innovative technology uses a small percentage of the power produced by the solar panel and for a very short period of time. In the case of other surfaces, the electronic circuit has to be powered by other external sources.

DETAILED DESCRIPTION OF THE INVENTION

All illustrations of the drawings are for the purpose of describing selected versions of the present invention and are not intended to limit the scope of the present invention.

Figure 1:
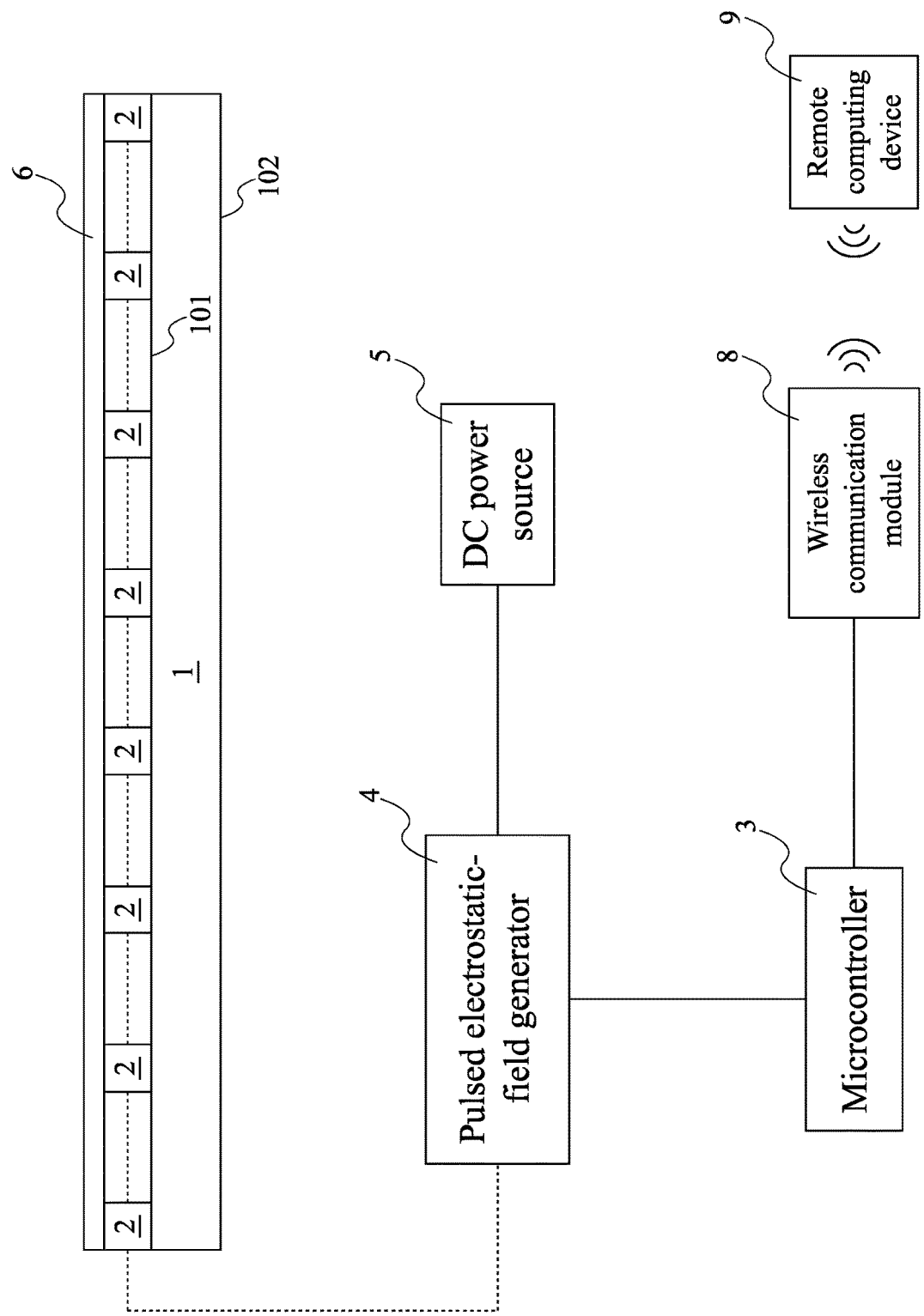
FIG. 1 is a block diagram illustrating the present invention.

As can be seen in FIG. 1, the present invention is a self-cleaning system for a light-receiving substrate 1 that is able to intelligent detect and automatically clean off dust, sand, dirt, or other kinds of particulates from the light-receiving substrate 1. In the preferred embodiment of the present invention, the light-receiving substrate 1 is a kind of solar panel and needs to be constantly cleaned in order to collect the most amount of power from the Sun. The present invention can also detect and melt off snow or ice deposits that may have accumulated on the light-receiving substrate 1. The present invention comprises a plurality of conductive traces 2, a microcontroller 3, a pulsed electrostatic-field generator 4, and a direct current (DC) power source 5. The plurality of conductive traces 2 is a group of electrodes that generates electrostatic waves. These electrostatic waves act as a contactless conveyor to levitate and move particulate off of the light-receiving substrate 1, which prevents any scratches or other kinds of damage to the light-receiving substrate 1. Each of the plurality of conductive traces 2 outputs a pulsed electrostatic field that is created and managed by the pulsed electrostatic-field generator 4. The microprocessor provides the other components of the present invention with the necessary instructions to enable the intelligent features of the present invention, such as when the present invention should activate its cleaning and/or snow-melting process. The DC power source 5 is used to electrically power the other components of the present invention. The DC power source 5 is preferably a high-voltage power source and can be, but is not limited to, a battery, a thermal power generator, a wind power generator, a utility grid, or a combination thereof.

The general configuration for the aforementioned components allows the present invention to effectively and efficiently generate electrostatic waves from independently-functioning conductive traces. Thus, the plurality of conductive traces 2 is arranged onto and across a designated surface 101 of the light-receiving substrate 1 in a non-intersecting pattern. The present invention has preferably four conductive traces. Examples of the non-intersecting pattern for the plurality of conductive traces 2 are shown in FIG. 13 through 19. The designated surface 101 is the surface that requires cleanliness in order to optimally operate the light-receiving substrate 1. The non-intersecting pattern allows the plurality of conductive traces 2 to be arranged on designated surface 101 so that electrostatic waves are generated to move particulate off of the designated surface 101 in a unidirectional manner. Conversely, the non-intersecting pattern also allows the plurality of conductive traces 2 to be arranged on designated surface 101 so that electrostatic waves are generated to move particulate off of the designated surface 101 in an omnidirectional manner. In addition, the DC power source 5 is electrically connected to each of the plurality of conductive traces 2 through the pulsed electrostatic-field generator 4, which allows the each of the plurality of conductive traces 2 to be electrically powered by the DC power source 5. The microcontroller 3 is electronically connected to the pulsed electrostatic-field generator 4 so that the microcontroller 3 is able to adjust various aspects of the pulsed electrostatic field that is outputted by each of the plurality of conductive traces 2.

Also for the general configuration, each of the plurality of conductive traces 2 needs to electrically insulated from each other in order to prevent electrical arcing between two or more conductive traces. In one embodiment, the present invention further comprises a transparent insulative coating 6 that is superimposed onto the designated surface 101. The transparent insulative coating 6 is used to increase the breakdown voltage between the plurality of conductive traces 2, which are resultantly positioned in between the transparent insulative coating 6 and the designated surface 101.

Figure 2:
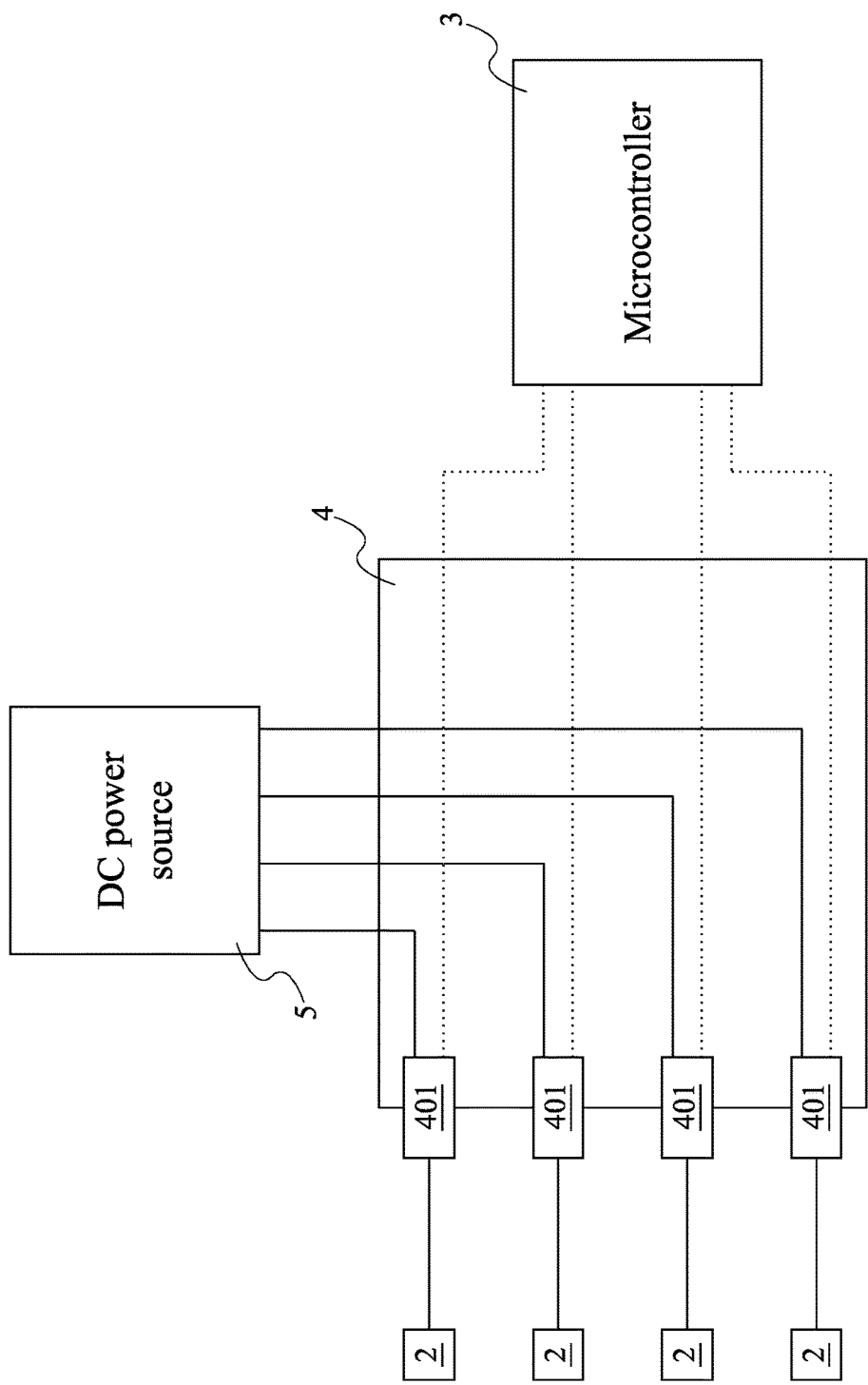
FIG. 2 is a block diagram illustrating the connection from the other components of the present invention to each conductive trace.

The pulsed electrostatic-field generator 4 is able to independently generate and control the pulsed electrostatic field that is outputted by each of the plurality of conductive traces 2. Thus, the pulsed electrostatic-field generator 4 needs to comprise a plurality of independent-field generating outputs 401, which are shown in FIG. 2. The plurality of independent-field generating outputs 401 allows the pulsed electrostatic-field generator 4 to separately configure each pulsed electrostatic field so that the combination of each pulsed electrostatic field forms electrostatic waves that efficiently and effectively move particulates off of the designated surface 101. Consequently, each of the plurality of conductive traces 2 is electrically connected to a corresponding output from the plurality of independent-field generating outputs 401. This configuration allows the DC power source 5 to be electrically connected to each of the plurality of conductive traces 2 through the corresponding output so that the DC power source 5 is able to independently power each of the plurality of conductive traces 2. This configuration also allows the microcontroller 3 to be electronically connected to each of the plurality of conductive traces 2 through the corresponding output so that the microcontroller 3 is able to independently control and manage each of the plurality of conductive traces 2.

Figure 3:
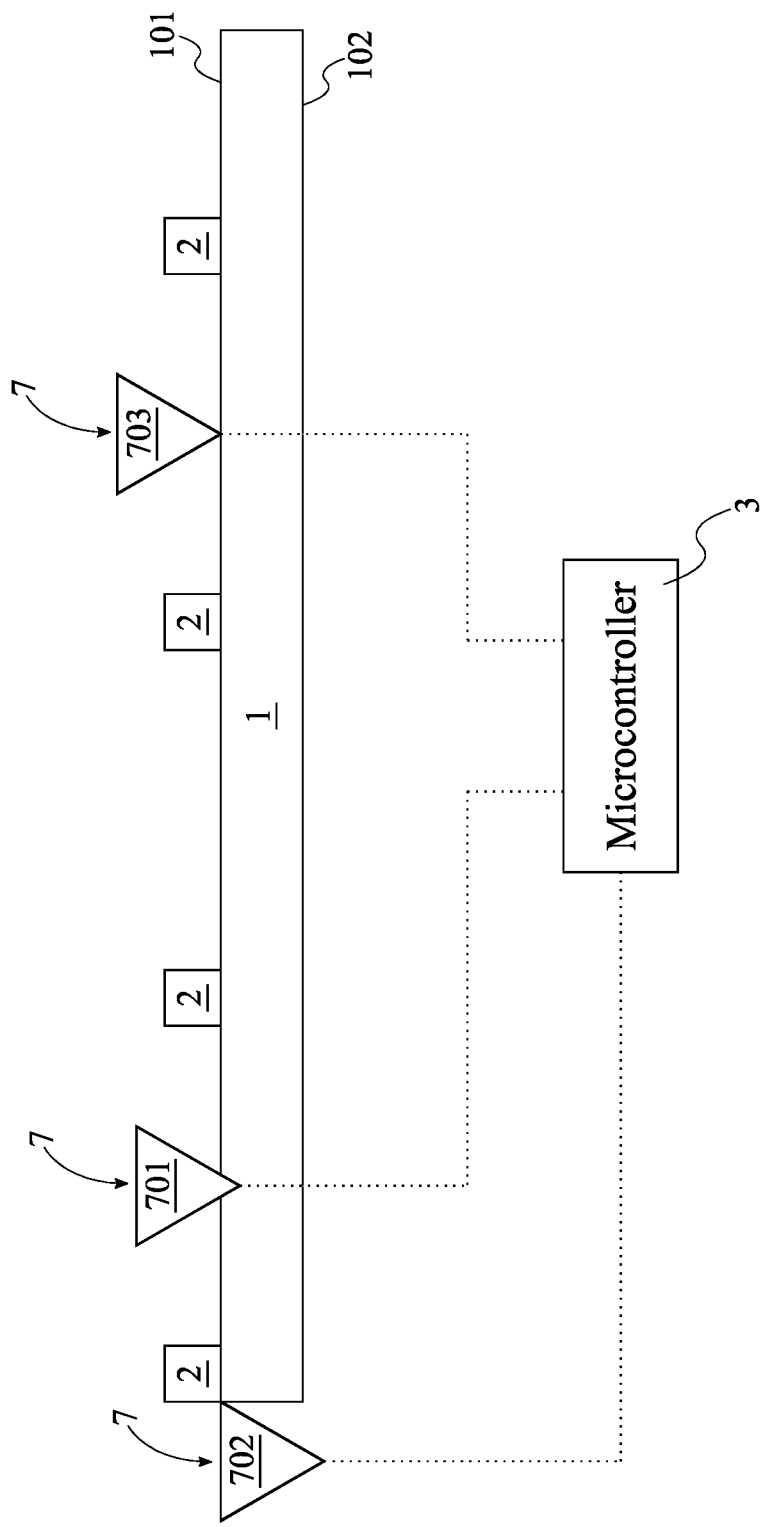
FIG. 3 is a block diagram illustrating the environmental sensors for the present invention.

In order to monitor the surroundings of the light-receiving substrate 1, the present invention further comprises a plurality of environmental sensors 7, which are used to detect situations that require cleaning of the designated surface 101. As can be seen in FIG. 3, the plurality of environmental sensors 7 is mounted adjacent to the designated surface 101 so that the plurality of environment sensors is able to immediately detect any obstructions that adversely affect the designated surface 101. Some examples of such obstructions include, but are not limited to, rain and snow. The microcontroller 3 is electronically connected to each of the plurality of environmental sensors 7, which allows the microcontroller 3 to retrieve data from the plurality of environmental sensors 7. This data can then be processed by the microcontroller 3 in order to determine whether or not the designated surface 101 needs to be cleaned off by the present invention.

More specifically, the plurality of environmental sensors 7 comprises at least one temperature sensor 701, at least one humidity sensor 702, and at least one luminosity sensor 703. The temperature sensor 701 is in thermal communication with the designated surface 101 so that the microcontroller 3 is able to receive temperature data for the designated surface 101. For example, the microcontroller 3 can determine if snow has fallen onto the designated surface 101 via the temperature sensor 701. The humidity sensor 702 is externally positioned to the light-receiving substrate 1 so that the microcontroller 3 is able to receive ambient-humidity data for the light-receiving substrate 1. The luminosity sensor 703 is directionally aligned with the designated surface 101 so that the luminosity sensor 703 is able to receive light in same direction and magnitude as the designated surface 101. For example, the microcontroller 3 can determine if heavy cloud cover is reducing the light received by the designated surface 101 because the humidity sensor 702 would detect a change in the ambient-humidity data and because the luminosity sensor 703 would detect a reduction in the light received by the designated surface 101. In this example, the microcontroller 3 would not activate the present invention to clean off the designated surface 101. In another example, the microcontroller 3 can determine if accumulated particulate is reducing the light received by the designated surface 101 because the humidity sensor 702 would not detect a change in the ambient-humidity data and because the luminosity sensor 703 would detect a reduction in the light received by the designated surface 101. In this example, the microcontroller 3 would activate the present invention to clean the designated surface 101.

The present invention can also be remotely activated to clean the designated surface 101. Thus, the present invention needs to further comprise a wireless communication module 8 and a remote computing device 9, which are shown in FIG. 1. The wireless communication module 8 is proximally located with the other components of the present invention and is used to send and receive communications for the microcontroller 3. Consequently, the microcontroller 3 is electronically connected to the wireless communication module 8. The remote computing device 9 is distally located from the other components of the present invention and is used to remotely communicate the microcontroller 3 or to remotely monitor the light-receiving substrate 1. Consequently, the remote computing device 9 is communicably coupled with the wireless communication module 8 8. For example, if the light-receiving substrate 1 is a solar panel located in the desert, then a user of the present invention would need the remote computing device 9 in order to communicate with the microcontroller 3 and/or to run diagnostics on certain components of the present invention.

Figure 4:
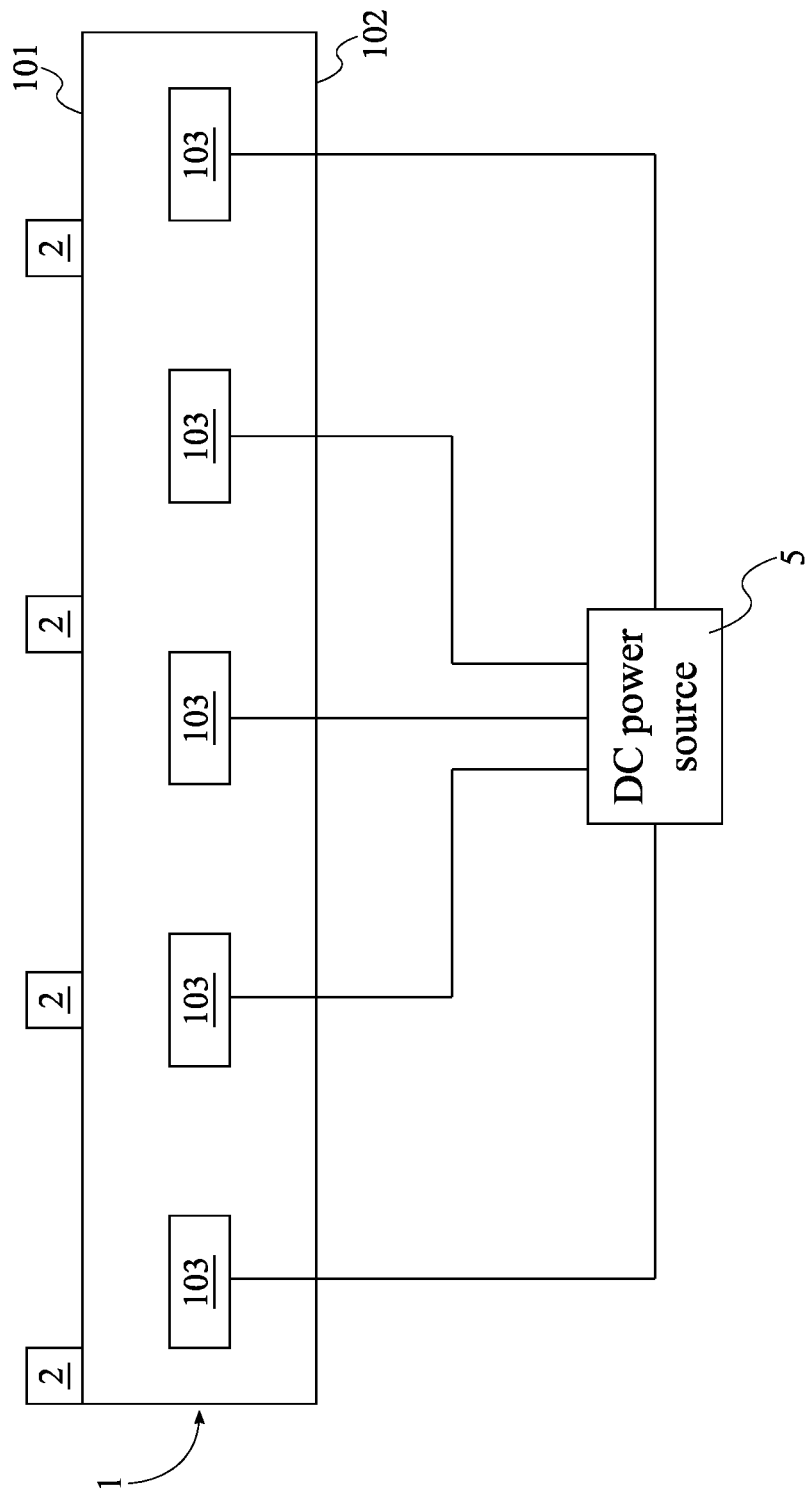
FIG. 4 is a block diagram illustrating the light-receiving substrate with solar cells.
Figure 5:
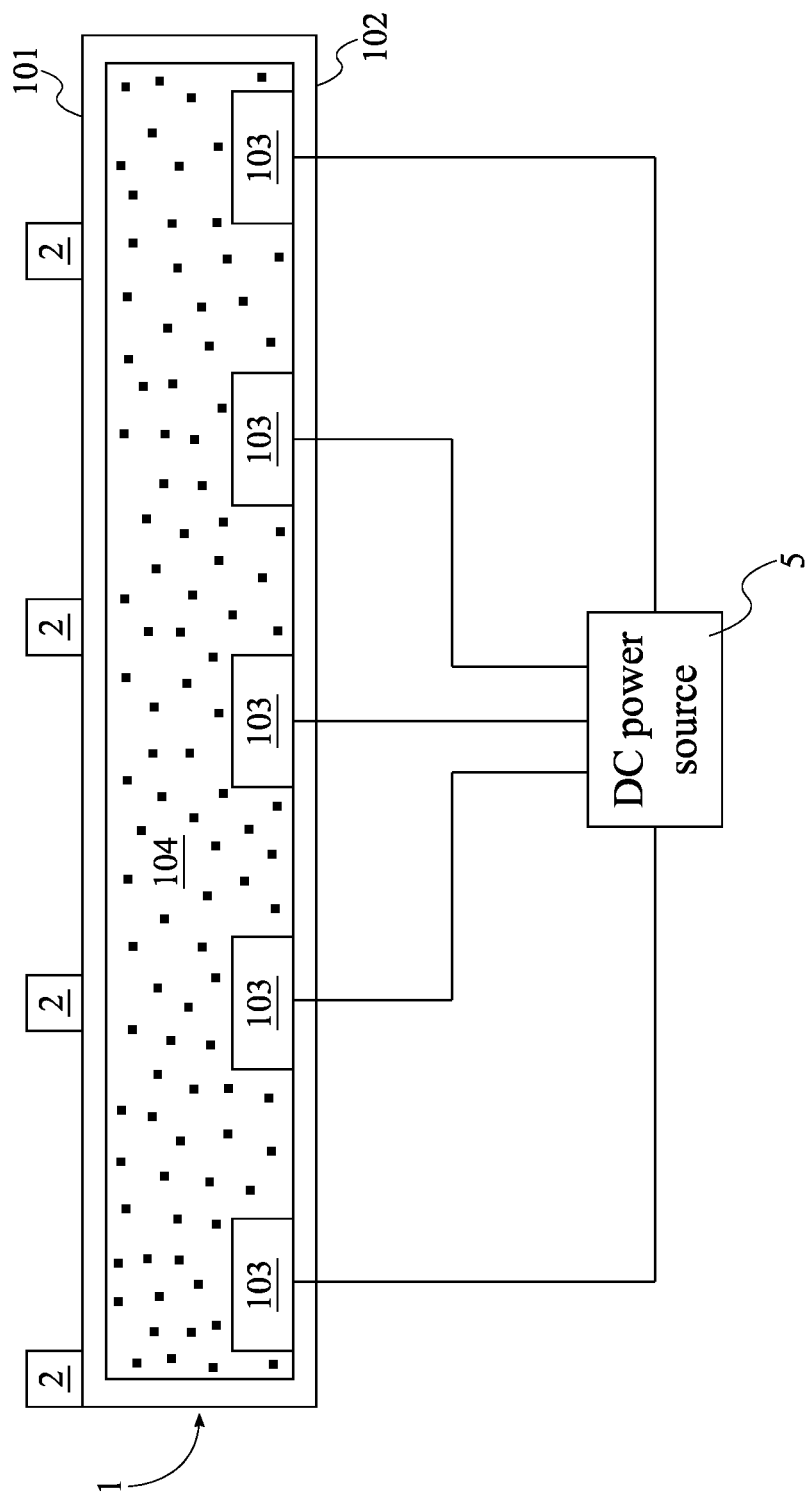
FIG. 5 is a block diagram illustrating the light-receiving substrate with solar cells and a vacuum chamber.

The present invention can have various implementations of the light-receiving substrate 1. The light-receiving substrate 1 is typically made of glass or polymer and can be, but is not limited to, a photovoltaic solar panel, a thermal solar panel, a vacuum solar panel, a mirror, a piece of glass, a windshield, an optical device, or a façade. However, these various implementations of the light-receiving substrate 1 can alter the components and/or the arrangement of those components for the present invention. As can be seen in FIG. 4, one implementation of the light-receiving substrate 1 comprises a plurality of solar cells 103, which are used to capture solar energy and to convert solar energy into electrical energy. The plurality of solar cells 103 can typically be photovoltaic (that is made of Polycrystalline Silicon) or thin film. In order to collect the maximum amount of solar energy with the plurality of solar cells 103, the plurality of conductive traces 2 needs to be transparent, and the plurality of solar cells 103 needs to be distributed throughout the light-receiving substrate 1. The plurality of solar cells 103 is also electrically connected to the DC power source 5 so that the plurality of solar cells 103 recharges the DC power source 5 as the DC power source 5 expends energy to electrically power the plurality of conductive traces 2. More specifically, the light-receiving substrate 1 further comprises a vacuum chamber 104, which is shown in FIG. 5. The plurality of solar cells 103 is positioned within the vacuum chamber 104 and is positioned adjacent to an opposing surface 102 of the light-receiving substrate 1. The designated surface 101 and the opposing surface 102 are opposite surfaces of the light-receiving substrate 1. Consequently, this configuration for the plurality of solar cells 103 and the vacuum chamber 104 allows the plurality of solar cells 103 to be more thermally insulated within the light-receiving substrate 1. The plurality of solar cells 103 is able to better execute the photovoltaic process at lower temperatures. The plurality of solar cells 103 may alternatively be positioned within the vacuum chamber 104 without contacting the light-receiving substrate 1.

Figure 6:
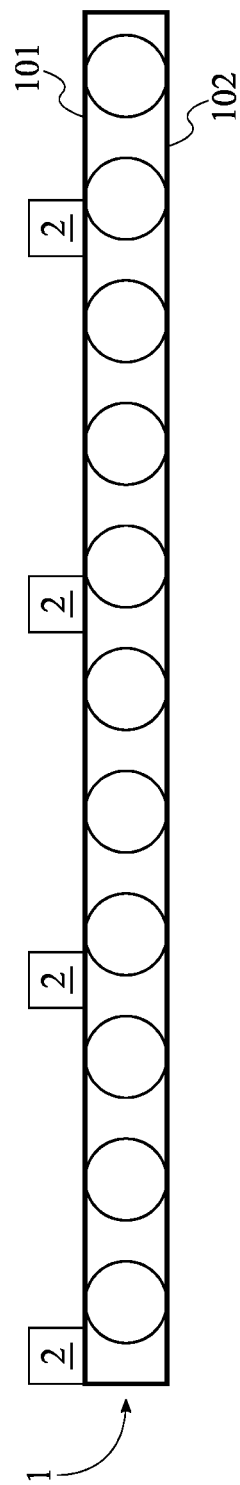
FIG. 6 is a block diagram illustrating the light-receiving substrate as a thermal solar panel.

As can be seen in FIG. 6, another implementation of the light-receiving substrate 1 is a thermal solar panel, which typically is a set of transparent tubes that retain some kind of fluid. These transparent tubes are then mounted within a transparent hollow enclosure. For this implementation of the light-receiving substrate 1, the plurality of conductive traces 2 also needs to be transparent so that the thermal solar panel is able to collect the maximum amount of solar energy and is able to convert that solar energy into thermal energy.

Figure 8:
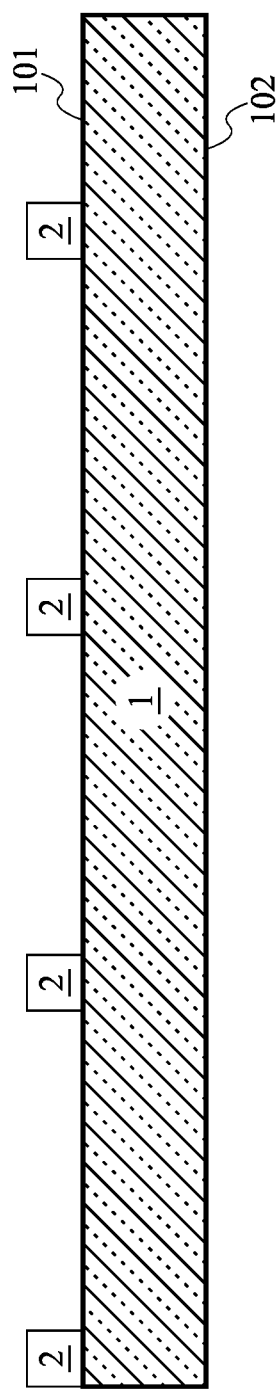
FIG. 8 is a block diagram illustrating the light-receiving substrate as a transparent panel.
Figure 9:
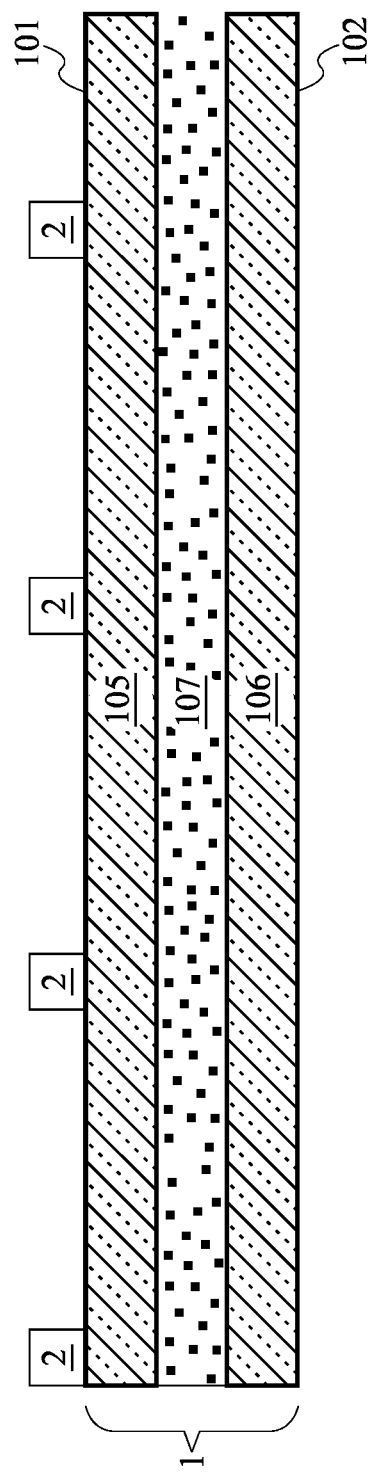
FIG. 9 is a block diagram illustrating the light-receiving substrate as a transparent panel with a vacuum layer.

Another implementation of the light-receiving substrate 1 is a transparent panel depicted in FIG. 8, such as the piece of glass or the windshield. For this implementation of the light-receiving substrate 1, the plurality of conductive traces 2 also needs to be transparent so that the transparent panel is able to provide the maximum amount of visibility through the present invention. More specifically, this implementation of the light-receiving substrate 1 depicted in FIG. 9 comprises a first glass layer 105, a second glass layer 106, and a vacuum layer 107, which are used to increase the thermal insulative properties of the transparent panel. Thus, the vacuum layer 107 needs to be hermetically sealed in between the first glass layer 105 and the second glass layer 106, which allows the transparent panel to maintain the vacuum layer 107.

Figure 7:
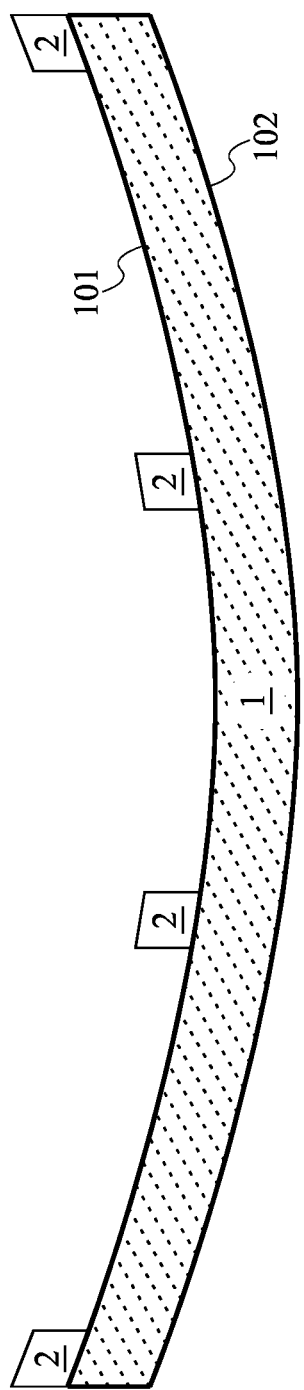
FIG. 7 is a block diagram illustrating the light-receiving substrate as a reflector.

As can be seen in FIG. 7, another implementation of the light-receiving substrate 1 is as a reflector, which is used reflect the light received by the designated surface 101. In order to maximize the functionality of this implementation of the light-receiving substrate 1, the plurality of conductive traces 2 needs to be reflective. This implementation of the light-receiving substrate 1 can be used as a solar reflector to concentrate and collect solar energy. This implementation of light-receiving substrate 1 also allows the light-receiving substrate 1 to be configured into either a flat, semi-cylindrical, or parabolic shape.

Figure 10:
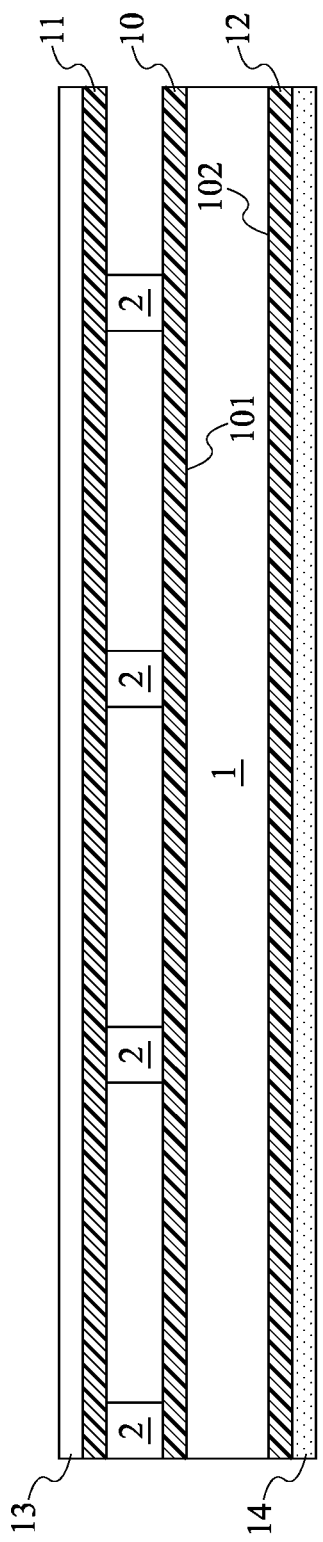
FIG. 10 is a block diagram illustrating the light-receiving substrate, the transparent protective sheet, and the rigid sheet being adhered together with transparent insulative resin.
Figure 11:
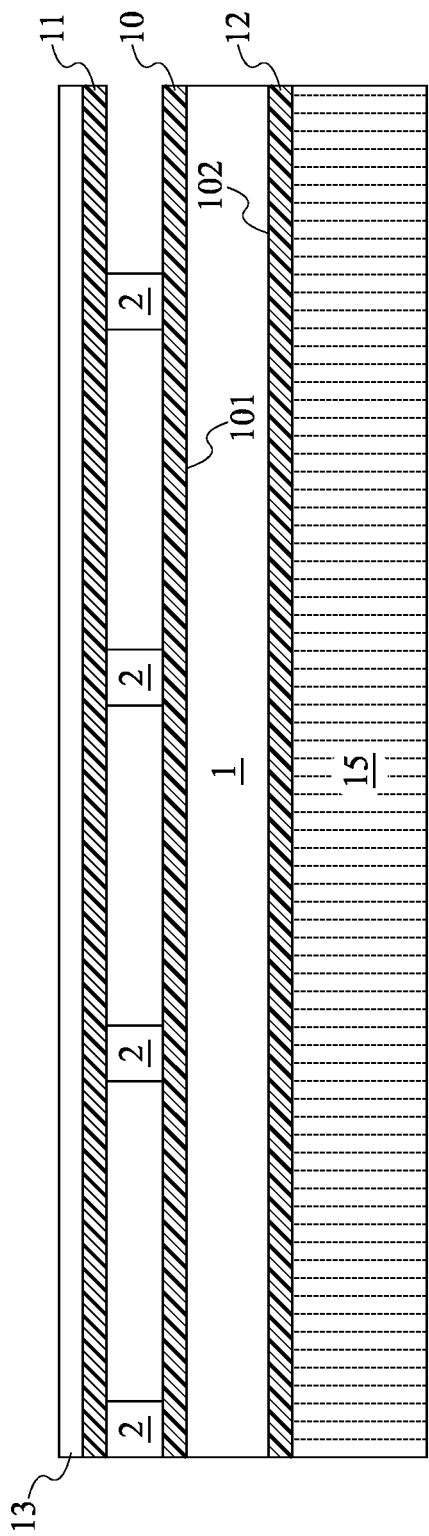
FIG. 11 is a block diagram illustrating the light-receiving substrate, the transparent protective sheet, and the heat-dissipating fixture being adhered together with transparent insulative resin.

As can be seen in FIGS. 10 and 11, transparent insulative resin is used in various instances to structurally affix certain components of the present invention to the light-receiving substrate 1. In one such instance, the plurality of conductive traces 2 is adhered to the designated surface 101 by a first layer of transparent insulative resin 10. The first layer of transparent insulative resin 10 allows light to travel past the plurality of conductive traces 2 and to travel into the light-receiving substrate 1 with minimal obstruction. In another such instance, a transparent protective sheet 13 is adhered onto and across the designated surface 101 by a second layer of transparent insulative resin 11. The transparent protective sheet 13 is typically made of polymer or another equivalent material. The transparent protective sheet 13 is a durable shield that protects the plurality of conductive traces 2 from physical damage, and, thus, the plurality of conductive traces 2 is positioned in between the transparent protective sheet 13 and the designated surface 101. The second layer of transparent insulative resin allows light to travel past the transparent protective sheet 13 and the plurality of conductive traces 2 and to travel into the light-receiving substrate 1 with minimal obstruction. In both of the aforementioned instances, the first layer of transparent insulative resin 10, the second layer of transparent insulative resin 11, and the transparent protective sheet 13 is also used to further prevent electrical arcing between two or more conductive traces.

A third layer of transparent insulative resin 12 can be used to adhere certain components to the opposing surface 102 of the light-receiving substrate 1. As described before, the designated surface 101 and the opposing surface 102 are opposite surfaces of the light-receiving substrate 1. In reference to FIG. 10, one component of the present invention that can be adhered to the opposing surface 102 by the third layer of transparent insulative resin 12 is a rigid sheet 14, which provides a structural base for the light-receiving substrate 1. The rigid sheet 14 is typically made of a compound material that is capable of withstanding structural stress and strain. In reference to FIG. 11, another component of the present invention that can be adhered to the opposing surface 102 by the third layer of transparent insulative resin 12 is a heat-dissipating fixture 15, which is used to transfer heat out of the light-receiving substrate 1. The heat-dissipating fixture 15 is typically made of rigid, lightweight metals that are used in heat sinks. The heat-dissipating fixture 15 is particularly useful when the light-receiving substrate 1 comprises the plurality of solar cells 103 because the plurality of solar cells 103 is able to optimally function at lower temperatures. The heat-dissipating fixture 15 is preferably a honeycomb structure. The heat-dissipating fixture 15 is also adhered onto and across the opposing surface 102 so that the heat-dissipating fixture 15 is able to transfer heat out of any portion of the light-receiving substrate 1.

Figure 12:
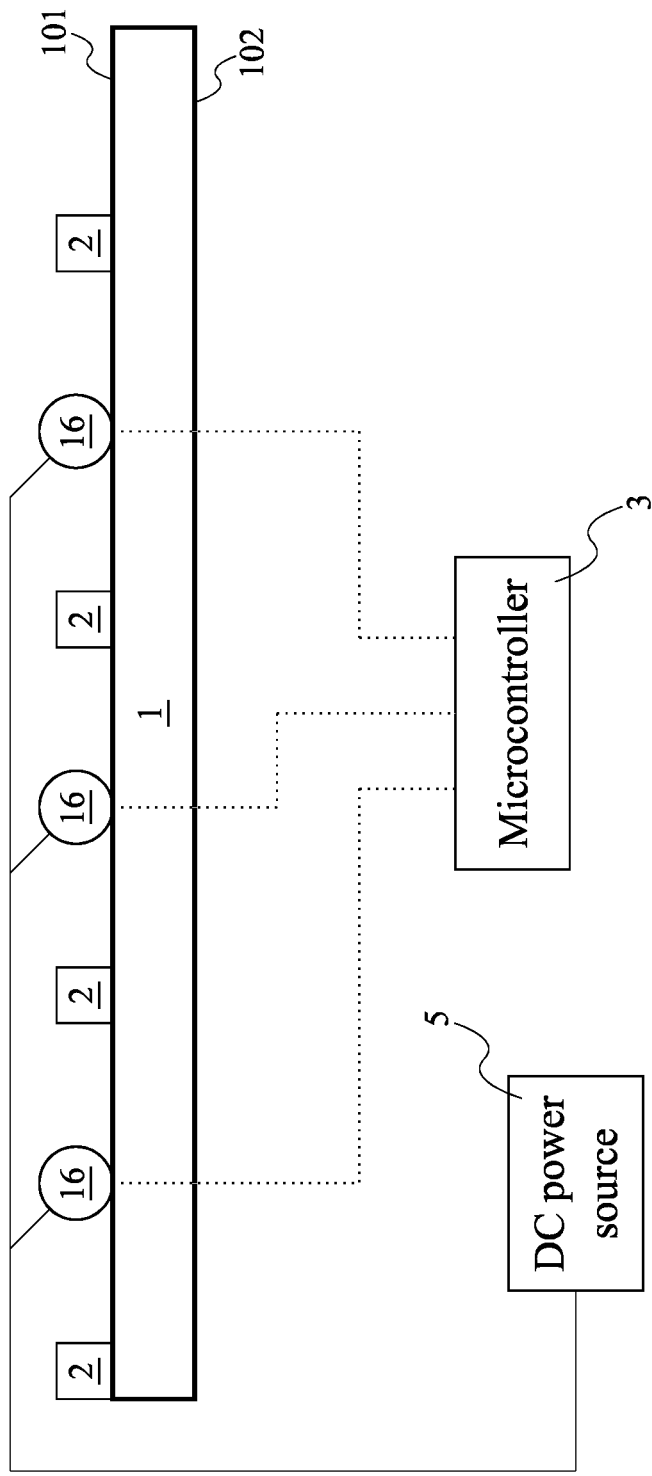
FIG. 12 is a block diagram illustrating the piezoelectric devices for the present invention.
Figure 13:
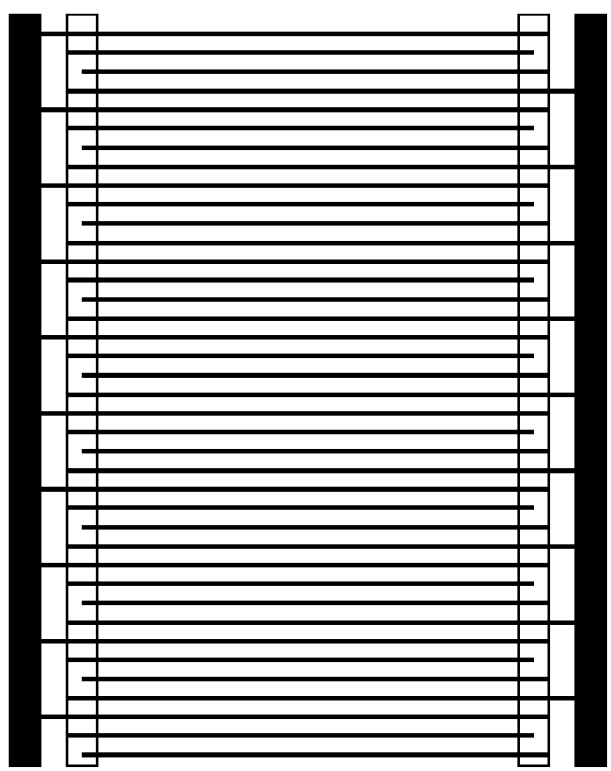
FIG. 13 is a schematic illustrating one configuration of the conductive traces for the present invention.
Figure 14:
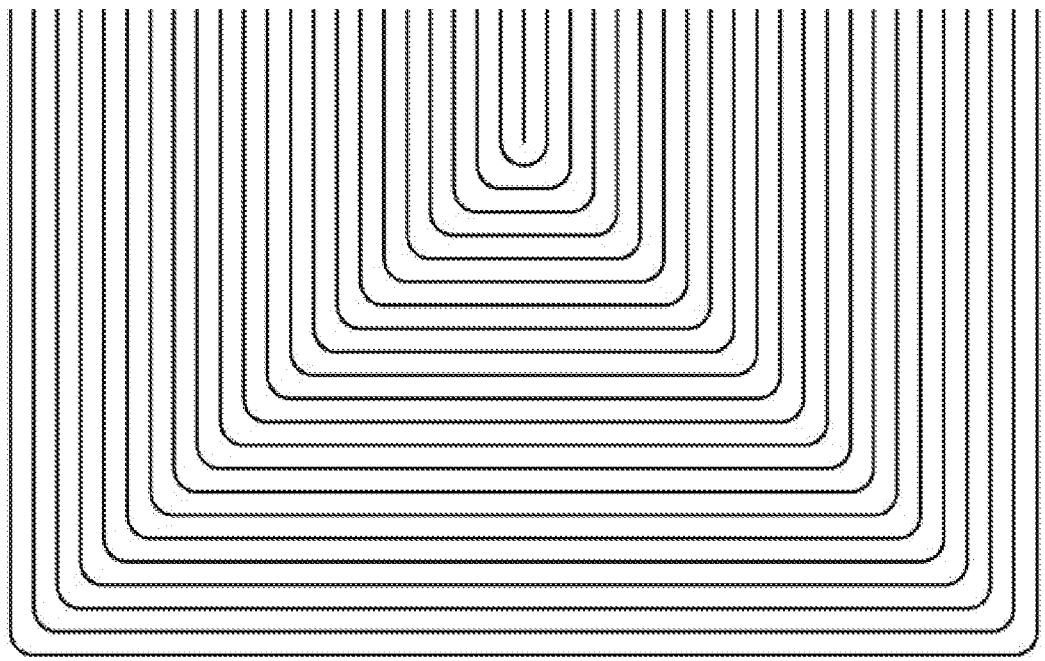
FIG. 14 is a schematic illustrating one configuration of the conductive traces for the present invention.
Figure 15:
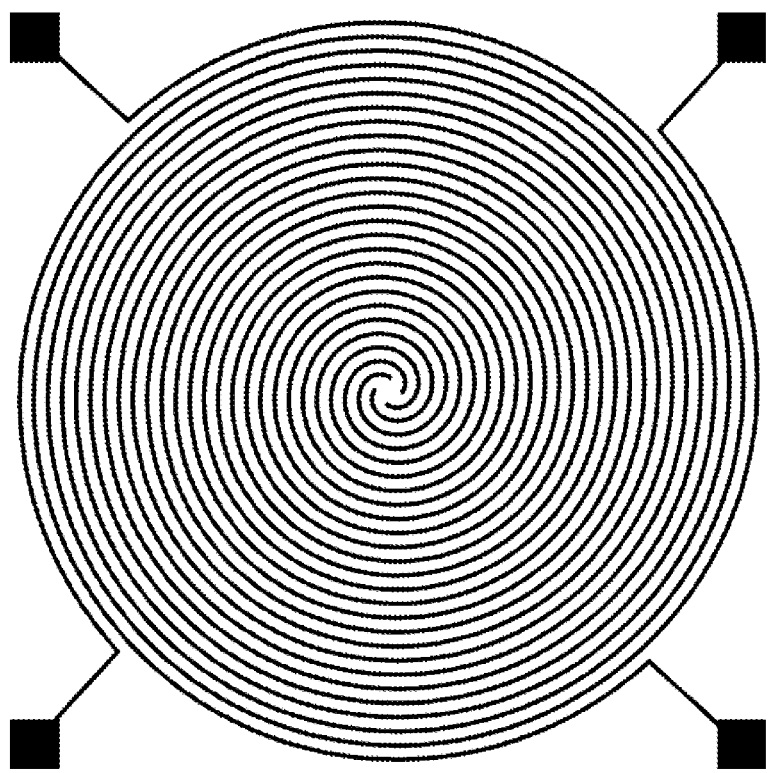
FIG. 15 is a schematic illustrating another configuration of the conductive traces for the present invention.
Figure 16:
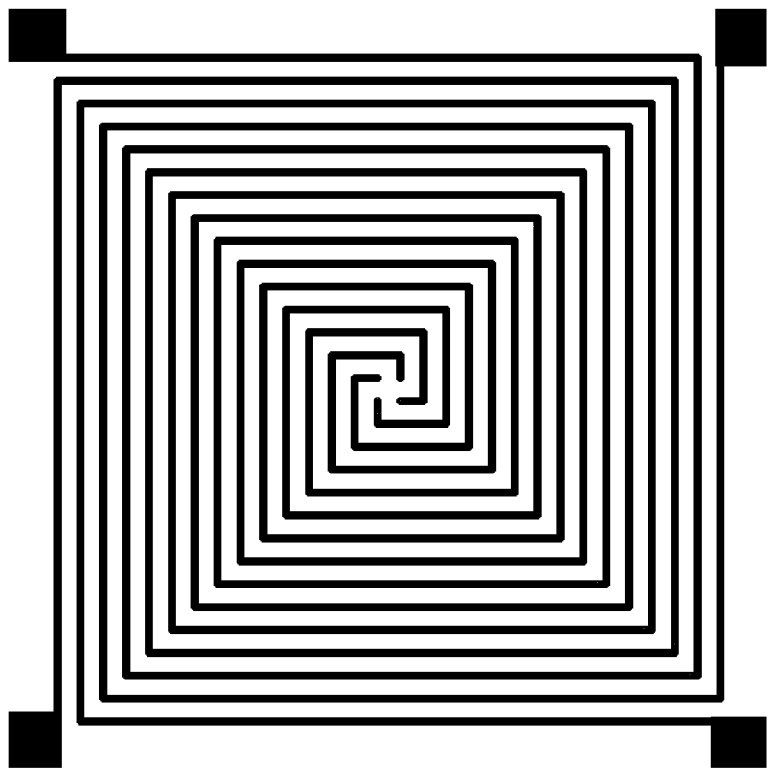
FIG. 16 is a schematic illustrating another configuration of the conductive traces for the present invention.
Figure 17:
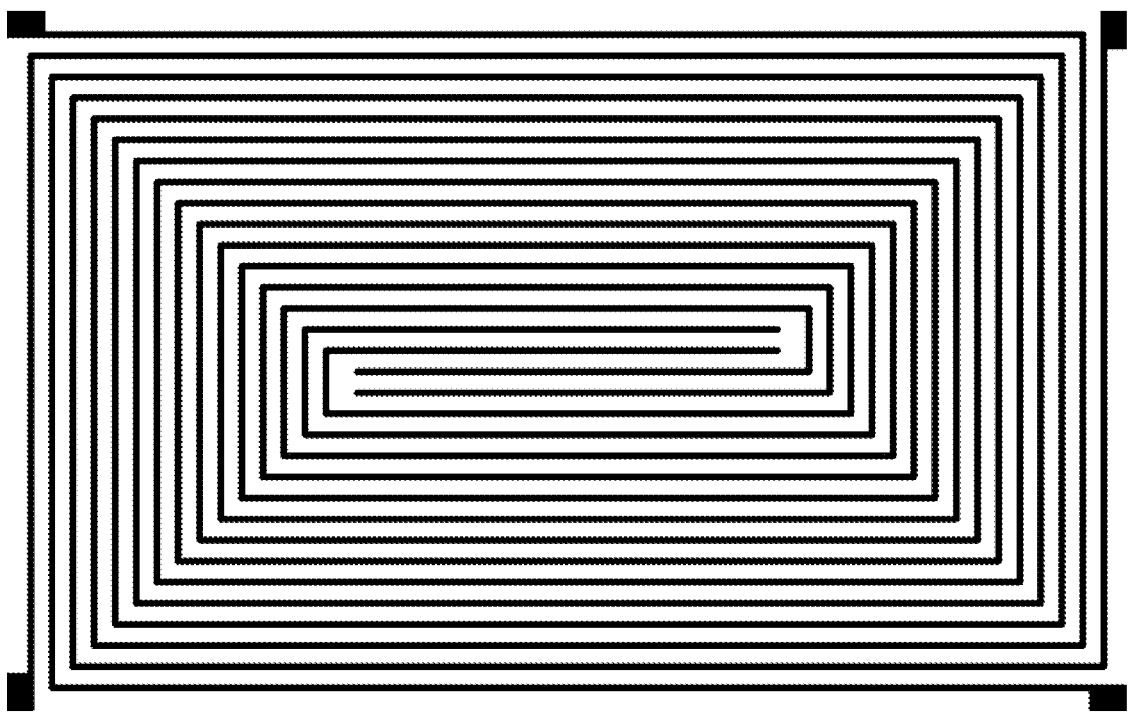
FIG. 17 is a schematic illustrating another configuration of the conductive traces for the present invention.
Figure 18:
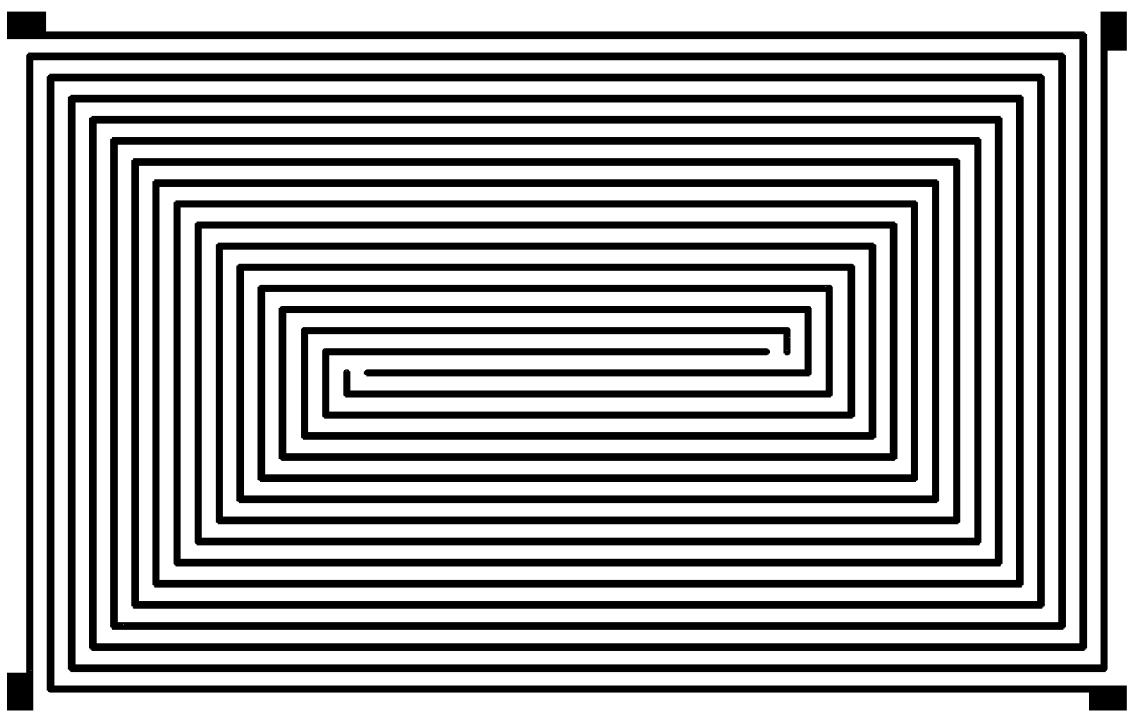
FIG. 18 is a schematic illustrating another configuration of the conductive traces for the present invention.
Figure 19:
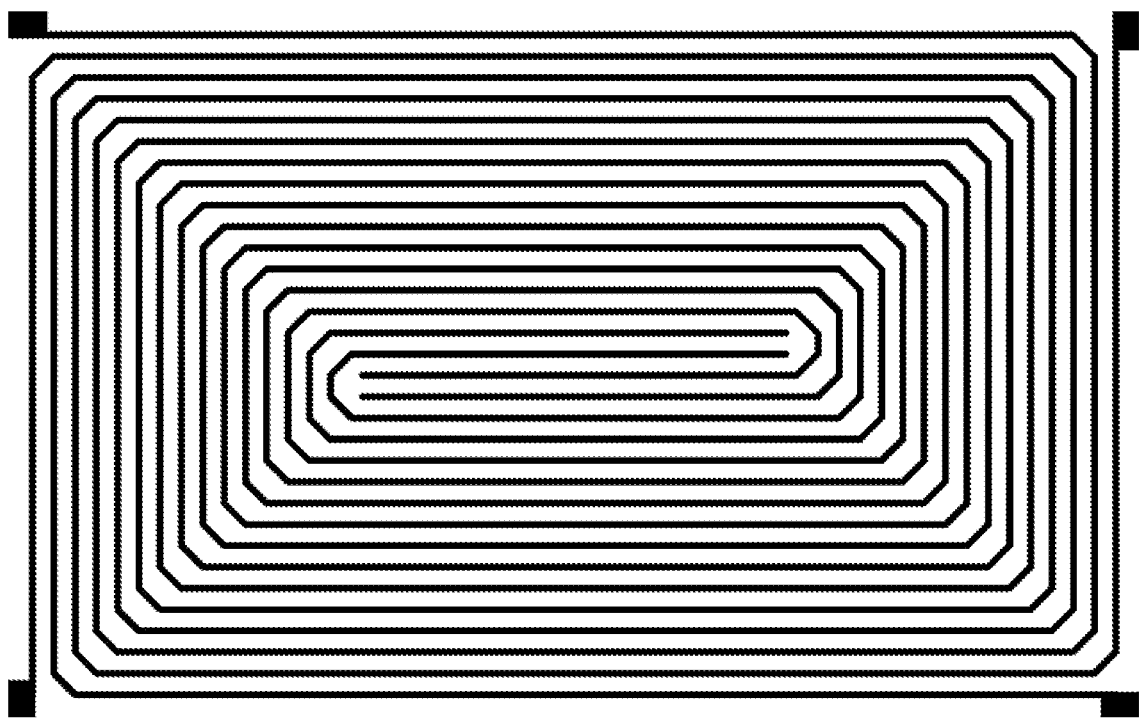
FIG. 19 is a schematic illustrating another configuration of the conductive traces for the present invention.

In order to enhance the ability to clean particulate off of the designated surface 101, the present invention further comprises a plurality of piezoelectric devices 16 depicted in FIG. 12, which allow electrical power to be converted into mechanical stress and vice versa. In addition to the electrostatic waves generated by the present invention, the plurality of piezoelectric devices 16 is used to generate ultrasonic waves and to physically vibrate particulate off of the designated surface 101. Thus, the plurality of piezoelectric devices 16 is distributed onto and across the designated surface 101 in order to generate ultrasonic waves for every portion of the designated surface 101. The microcontroller 3 is electronically connected to the plurality of piezoelectric devices 16 so that the microcontroller 3 is able to simultaneously activate the plurality of conductive traces 2 and the plurality of piezoelectric devices 16. The DC power source 5 is also electrically connected to the plurality of piezoelectric devices 16, which allows the DC power source 5 to electrically power the plurality of piezoelectric devices 16 as well as the plurality of conductive traces 2.

Although the invention has been explained in relation to its preferred embodiment, it is to be understood that many other possible modifications and variations can be made without departing from the spirit and scope of the invention as hereinafter claimed.

What is claimed is:

1. A self-cleaning system comprising:
a light-receiving substrate;
a plurality of solar cells;
a plurality of piezoelectric devices;
a plurality of conductive traces;
a microcontroller;
a pulsed electrostatic-field generator;
a direct current (DC) power source;
a transparent insulative coating;
a plurality of environmental sensors;
a wireless communication module;
a remote computing device;
the light-receiving substrate comprising a light-receiving surface, an opposing surface, and a vacuum chamber;
the pulsed electrostatic-field generator comprising a plurality of independent-field generating outputs;
the light-receiving surface and the opposing surface being opposite surfaces of the light-receiving substrate;
the vacuum chamber being formed in between the light-receiving surface and the opposing surface;
the plurality of solar cells being positioned within the vacuum chamber;
the plurality of solar cells being positioned adjacent to the opposing surface;
the plurality of conductive traces being arranged on top and across the light-receiving surface in a non-intersecting pattern;
each of the plurality of conductive traces being electrically insulated from each other;
the plurality of piezoelectric devices being distributed on top and across the light-receiving surface;
the plurality of piezoelectric devices being separate from each other;
a corresponding piezoelectric device among the plurality of piezoelectric devices being located in between two adjacent conductive traces among the plurality of conductive traces;
the plurality of conductive traces being electrically connected to the DC power source through the microcontroller;
the microcontroller being electronically connected to the pulsed electrostatic-field generator;
the DC power source being electrically connected to each of the plurality of conductive traces through the pulsed electrostatic-field generator;
the transparent insulative coating being superimposed on top the light-receiving surface;
the plurality of conductive traces being positioned in between the transparent insulative coating and the light-receiving surface;
each of the plurality of conductive traces being electrically connected to a corresponding output from the plurality of independent-field generating outputs;
the DC power source being electrically connected to each of the plurality of conductive traces through the corresponding output;
the microcontroller being electronically connected to each of the plurality of conductive traces through the corresponding output;
the plurality of environmental sensors being mounted adjacent to the light-receiving surface;
the microcontroller being electronically connected to the plurality of environmental sensors;
the microcontroller being electronically connected to the plurality of piezoelectric devices;
the DC power source being electrically connected to the plurality of piezoelectric devices;
the microcontroller being electronically connected to the wireless communication module; and
the wireless communication module being communicably coupled to the remote computing device.

2. The self-cleaning system as claimed in claim 1 comprising:
the plurality of environmental sensors comprising at least one temperature sensor; and
the temperature sensor being in thermal communication with the light-receiving surface.

3. The self-cleaning system as claimed in claim 1 comprising:
the plurality of environmental sensors comprising at least one humidity sensor; and
the humidity sensor being externally positioned to the light-receiving substrate.

4. The self-cleaning system as claimed in claim 1 comprising:
the plurality of environmental sensors comprising at least one luminosity sensor; and
the luminosity sensor being directionally aligned with the light-receiving surface.

5. The self-cleaning system as claimed in claim 1 comprising:
the plurality of conductive traces being transparent; and
the plurality of solar cells being electrically connected to the DC power source.

6. The self-cleaning system as claimed in claim 1 comprising:
the plurality of conductive traces being transparent; and
the light-receiving substrate being a transparent panel.

7. The self-cleaning system as claimed in claim 1 comprising:

a layer of transparent insulative resin; and
the plurality of conductive traces being adhered to the light-receiving surface by the layer of transparent insulative resin.

8. The self-cleaning system as claimed in claim 1 comprising:
a transparent protective sheet;
a layer of transparent insulative resin;
the transparent protective sheet being adhered on top and across the light-receiving surface by the layer of transparent insulative resin; and
the plurality of conductive traces being positioned in between the transparent protective sheet and the light-receiving surface.

9. The self-cleaning system as claimed in claim 8 comprising:
a rigid sheet;
a layer of transparent insulative resin;
the rigid sheet being adhered onto and across the opposing surface; and
the rigid sheet being adhered onto and across the opposing surface by the layer of transparent insulative resin.

10. The self-cleaning system as claimed in claim 1 comprising:
a heat-dissipating fixture;
a layer of transparent insulative resin; and
the heat-dissipating fixture being adhered onto and across the opposing surface by the layer of transparent insulative resin.

11. The self-cleaning system as claimed in claim 10, wherein the heat-dissipating fixture is a honeycomb structure.

12. A self-cleaning system comprising:
a light-receiving substrate;
a plurality of solar cells;
a plurality of piezoelectric devices;
a plurality of conductive traces;
a microcontroller;
a pulsed electrostatic-field generator;
a direct current (DC) power source;
a transparent insulative coating;
a plurality of environmental sensors;
a wireless communication module;
a remote computing device;
the light-receiving substrate comprising a light-receiving surface, an opposing surface, and a vacuum chamber;
the pulsed electrostatic-field generator comprising a plurality of independent-field generating outputs;
the plurality of environmental sensors comprising at least one temperature sensor, at least one humidity sensor, and at least one luminosity sensor;
the light-receiving surface and the opposing surface being opposite surfaces of the light-receiving substrate;
the vacuum chamber being formed in between the light-receiving surface and the opposing surface;
the plurality of solar cells being positioned within the vacuum chamber;
the plurality of solar cells being positioned adjacent to the opposing surface;
the plurality of conductive traces being arranged on top and across the light-receiving surface in a non-intersecting pattern;
each of the plurality of conductive traces being electrically insulated from each other;
the plurality of piezoelectric devices being distributed on top and across the light-receiving surface;
the plurality of piezoelectric devices being separate from each other;
a corresponding piezoelectric device among the plurality of piezoelectric devices being located in between two adjacent conductive traces among the plurality of conductive traces;
the plurality of conductive traces being electrically connected to the DC power source through the microcontroller;
the microcontroller being electronically connected to the pulsed electrostatic-field generator;
the DC power source being electrically connected to each of the plurality of conductive traces through the pulsed electrostatic-field generator;
the transparent insulative coating being superimposed on top the light-receiving surface;
the plurality of conductive traces being positioned in between the transparent insulative coating and the light-receiving surface;
each of the plurality of conductive traces being electrically connected to a corresponding output from the plurality of independent-field generating outputs;
the DC power source being electrically connected to each of the plurality of conductive traces through the corresponding output;
the microcontroller being electronically connected to each of the plurality of conductive traces through the corresponding output;
the plurality of environmental sensors being mounted adjacent to the light-receiving surface;
the microcontroller being electronically connected to the plurality of environmental sensors;
the microcontroller being electronically connected to the plurality of piezoelectric devices;
the DC power source being electrically connected to the plurality of piezoelectric devices;
the microcontroller being electronically connected to the wireless communication module;
the wireless communication module being communicably coupled to the remote computing device;
the temperature sensor being in thermal communication with the light-receiving surface;
the humidity sensor being externally positioned to the light-receiving substrate; and
the luminosity sensor being directionally aligned with the light-receiving surface.

13. The self-cleaning system as claimed in claim 12 comprising:
the plurality of conductive traces being transparent; and
the plurality of solar cells being electrically connected to the DC power source.

14. The self-cleaning system as claimed in claim 12 comprising:
the plurality of conductive traces being transparent; and
the light-receiving substrate being a transparent panel.

15. The self-cleaning system as claimed in claim 12 comprising:
a first layer of transparent insulative resin;
a second layer of transparent insulative resin;
a transparent protective sheet;
the plurality of conductive traces being adhered to the light-receiving surface by the first layer of transparent insulative resin;
the transparent protective sheet being adhered on top and across the light-receiving surface by the second layer of transparent insulative resin; and the plurality of conductive traces being positioned in between the transparent protective sheet and the light-receiving surface.

16. The self-cleaning system as claimed in claim 15 comprising:
- a rigid sheet;
- a third layer of transparent insulative resin;
- the rigid sheet being adhered onto and across the opposing surface; and
- the rigid sheet being adhered onto and across the opposing surface by the third layer of transparent insulative resin.

17. The self-cleaning system as claimed in claim 15 comprising:
- a heat-dissipating fixture;
- a third layer of transparent insulative resin; and
- the heat-dissipating fixture being adhered onto and across the opposing surface by the third layer of transparent insulative resin.

18. The self-cleaning system as claimed in claim 17, wherein the heat-dissipating fixture is a honeycomb structure.

\* \* \* \* \*